United States Patent
Khusnatdinov et al.

(10) Patent No.: US 8,361,371 B2
(45) Date of Patent: Jan. 29, 2013

(54) EXTRUSION REDUCTION IN IMPRINT LITHOGRAPHY

(75) Inventors: Niyaz Khusnatdinov, Round Rock, TX (US); Christopher Ellis Jones, Austin, TX (US); Joseph G. Perez, Austin, TX (US); Dwayne L. LaBrake, Cedar Park, TX (US); Ian Matthew McMackin, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 492 days.

(21) Appl. No.: 12/367,079

(22) Filed: Feb. 6, 2009

(65) Prior Publication Data

US 2009/0200710 A1  Aug. 13, 2009

Related U.S. Application Data

(60) Provisional application No. 61/027,153, filed on Feb. 8, 2008, provisional application No. 61/094,092, filed on Sep. 4, 2008.

(51) Int. Cl.
*B28B 1/14* (2006.01)
*B27N 3/18* (2006.01)
*B29C 35/08* (2006.01)

(52) U.S. Cl. ........ 264/319; 264/293; 264/299; 264/330; 264/494; 264/496; 977/887

(58) Field of Classification Search .......... 264/319, 264/330, 494, 496, 293, 299; 977/887
See application file for complete search history.

(56) References Cited

U.S. PATENT DOCUMENTS

| | | | |
|---|---|---|---|
| 6,842,229 B2 | 1/2005 | Sreenivasan et al. | |
| 6,871,558 B2 | 3/2005 | Choi et al. | |
| 6,916,584 B2 * | 7/2005 | Sreenivasan et al. | 430/22 |
| 6,916,585 B2 | 7/2005 | Sreenivasan et al. | |
| 6,926,929 B2 | 8/2005 | Watts et al. | |
| 6,932,934 B2 | 8/2005 | Choi et al. | |
| 6,936,194 B2 | 8/2005 | Watts | |
| 6,980,282 B2 | 12/2005 | Choi et al. | |
| 6,990,870 B2 | 1/2006 | Choi et al. | |
| 7,019,819 B2 | 3/2006 | Choi et al. | |
| 7,036,389 B2 | 5/2006 | Choi et al. | |
| 7,071,088 B2 | 7/2006 | Watts et al. | |
| 7,090,716 B2 | 8/2006 | McMackin et al. | |
| 7,136,150 B2 * | 11/2006 | Sreenivasan et al. | 355/75 |
| 7,140,861 B2 | 11/2006 | Watts et al. | |
| 7,244,386 B2 | 7/2007 | Sreenivasan et al. | |
| 7,252,715 B2 | 8/2007 | Watts et al. | |
| 7,270,533 B2 | 9/2007 | McMackin et al. | |
| 7,279,113 B2 | 10/2007 | Watts et al. | |
| 7,281,919 B2 | 10/2007 | Shackleton et al. | |
| 7,298,456 B2 | 11/2007 | Cherala et al. | |
| 7,309,225 B2 * | 12/2007 | McMackin et al. | 425/215 |
| 7,316,554 B2 | 1/2008 | Choi et al. | |

(Continued)

FOREIGN PATENT DOCUMENTS

| | | |
|---|---|---|
| EP | 1001311 A1 | 5/2000 |
| EP | 1331516 A2 | 7/2003 |

(Continued)

*Primary Examiner* — Christina Johnson
*Assistant Examiner* — Atul P. Khare
(74) *Attorney, Agent, or Firm* — Cameron A. King

(57) ABSTRACT

Devices positioned between an energy source and an imprint lithography template may block exposure of energy to portions of polymerizable material dispensed on a substrate. Portions of the polymerizable material that are blocked from the energy may remain fluid, while the remaining polymerizable material is solidified.

6 Claims, 18 Drawing Sheets

U.S. PATENT DOCUMENTS

| | | |
|---|---|---|
| 7,338,275 B2 | 3/2008 | Choi et al. |
| 7,434,512 B2 * | 10/2008 | Bietsch et al. ............... 101/483 |
| 7,462,028 B2 | 12/2008 | Cherala et al. |
| 7,473,090 B2 | 1/2009 | McMackin et al. |
| 7,491,637 B2 | 2/2009 | Sreenivasan et al. |
| 7,762,186 B2 * | 7/2010 | Meijer et al. ................. 101/368 |
| 7,794,222 B2 * | 9/2010 | Suehira et al. ................ 425/150 |
| 2004/0008334 A1 | 1/2004 | Sreenivasan et al. |
| 2004/0065252 A1 | 4/2004 | Sreenivasan et al. |
| 2004/0163563 A1 | 8/2004 | Sreenivasan et al. |
| 2004/0168586 A1 * | 9/2004 | Bailey et al. .................... 101/3.1 |
| 2004/0192041 A1 * | 9/2004 | Jeong et al. ..................... 438/689 |
| 2004/0250945 A1 * | 12/2004 | Zheng et al. .................... 156/230 |
| 2005/0061773 A1 | 3/2005 | Choi et al. |
| 2005/0072757 A1 | 4/2005 | McMackin et al. |
| 2005/0084804 A1 | 4/2005 | Truskett et al. |
| 2005/0106321 A1 | 5/2005 | McMackin et al. |
| 2005/0160011 A1 | 7/2005 | Sreenivasan et al. |
| 2005/0189676 A1 | 9/2005 | Sreenivasan |
| 2005/0236739 A1 | 10/2005 | Willson et al. |
| 2005/0270312 A1 | 12/2005 | Lad et al. |
| 2005/0270516 A1 | 12/2005 | Cherala et al. |
| 2005/0276919 A1 | 12/2005 | Truskett et al. |
| 2006/0063112 A1 | 3/2006 | Sreenivasan |
| 2006/0076717 A1 | 4/2006 | Sreenivasan et al. |
| 2006/0077374 A1 | 4/2006 | Sreenivasan et al. |
| 2006/0115999 A1 | 6/2006 | Sreenivasan et al. |
| 2006/0121728 A1 | 6/2006 | McMackin et al. |
| 2006/0177532 A1 | 8/2006 | Fletcher et al. |
| 2006/0177535 A1 | 8/2006 | McMackin et al. |
| 2006/0266916 A1 | 11/2006 | Miller et al. |
| 2007/0063384 A1 | 3/2007 | Choi et al. |
| 2007/0114686 A1 | 5/2007 | Choi et al. |
| 2007/0126150 A1 | 6/2007 | GanapathiSubramanian et al. |
| 2007/0141271 A1 | 6/2007 | Xu et al. |
| 2007/0170617 A1 | 7/2007 | Choi et al. |
| 2007/0228593 A1 | 10/2007 | Jones et al. |
| 2007/0228608 A1 | 10/2007 | Shackleton et al. |
| 2007/0228610 A1 | 10/2007 | Sreenivasan et al. |
| 2007/0231981 A1 | 10/2007 | Sreenivasan et al. |
| 2007/0247608 A1 | 10/2007 | Sreenivasan et al. |
| 2008/0141862 A1 | 6/2008 | Xu et al. |
| 2008/0153312 A1 | 6/2008 | Sreenivasan et al. |
| 2008/0174046 A1 | 7/2008 | Choi et al. |
| 2008/0199816 A1 | 8/2008 | Choi et al. |
| 2008/0303187 A1 | 12/2008 | Stacey et al. |
| 2009/0014917 A1 | 1/2009 | Hodge et al. |
| 2009/0053535 A1 | 2/2009 | Xu et al. |

FOREIGN PATENT DOCUMENTS

EP              1582932 A2     3/2005

* cited by examiner

EXTRUSION REDUCTION IN IMPRINT LITHOGRAPHY

CROSS-REFERENCE TO RELATED APPLICATIONS

This application claims the benefit under 35 U.S.C. §119 (e)(1) of U.S. Provisional No. 61/027,153, filed on Feb. 8, 2008 and U.S. Provisional No. 61/094,092, filed on Sep. 4, 2008, both of which are hereby incorporated by reference herein.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
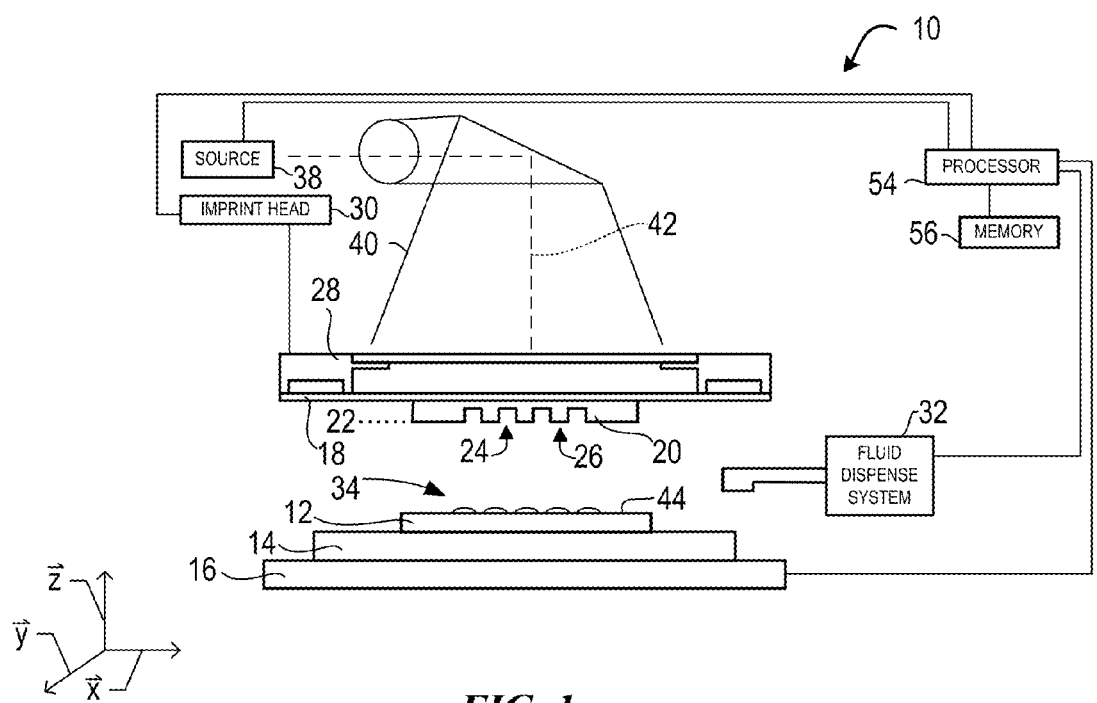
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide motion along the x, y, and z axes. Stage 16, substrate 12, and substrate chuck 14 may also be positioned on a base (not shown).

Spaced-apart from substrate 12 is template 18. Template 18 may include mesa 20 extending therefrom towards substrate 12, mesa 20 having a patterning surface 22 thereon. Further, mesa 20 may be referred to as mold 20. Alternatively, template 18 may be formed without mesa 20.

Template 18 and/or mesa 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. For example, polymerizable material 34 may be positioned upon substrate 12 using techniques such as those described in U.S. Patent Publication No. 2005/0270312 and U.S. Patent Publication No. 2005/0106321, both of which are hereby incorporated by reference herein. Polymerizable material 34 may be disposed upon substrate 12 before and/or after a desired volume is defined between mesa 20 and substrate 12 depending on design considerations. Polymerizable material 34 may comprise a monomer mixture as described in U.S. Pat. No. 7,157,036 and U.S. Patent Publication No. 2005/0187339, both of which are hereby incorporated by reference herein.

Figure 2:
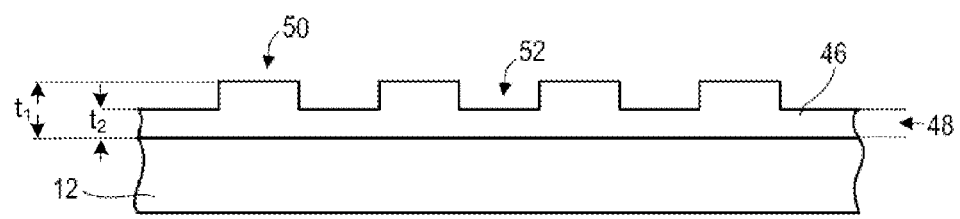
FIG. 2 illustrates a simplified side view of the substrate shown in FIG. 1 having a patterned layer positioned thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mesa 20 and substrate 12 to define a desired volume therebetween that is filled by polymerizable material 34. For example, imprint head 30 may apply a force to template 18 such that mesa 20 contacts polymerizable material 34. After the desired volume is filled with polymerizable material 34, source 38 produces energy 40, e.g., ultraviolet radiation, causing polymerizable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, all of which are hereby incorporated by reference herein.

Figure 3:
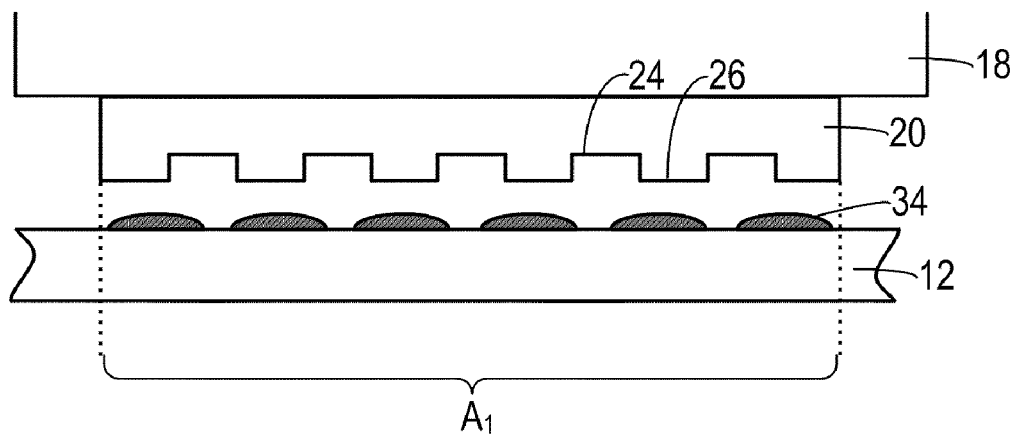
FIG. 3 illustrates a simplified side view of the template and the substrate shown in FIG. 1.

Referring to FIGS. 2 and 3, during formation of patterned layer 46, polymerizable material 34 fills the volume between features 24 and 26 of template 18 and the edge of mesa 20 within a desired imprint area $A_1$ on substrate 12. For example, the desired imprint area $A_1$ may be between the boundaries of mesa 20. In certain circumstances, polymerizable material 34 may flow out of the area $A_1$ and result in extrusion formation. For example, extrusions may be created at the edge of the boundary of mesa 20 if the drop pattern on substrate 12 is not centered with template 18. Extrusion formation may lead to particle spray during separation of template 18 and patterned layer 46. Additionally, extrusions may limit the size of patterned layer 46, provide for defects, reduce the shelf life of template 18, and/or may lead to a non-uniform patterned layer 46 with subsequent planarization issues. The following systems and methods may be used singularly or in combination to reduce and/or prevent extrusions.

Varying Dimensions

Extrusions may be reduced and/or prevented by varying dimensions of mesa 20 and/or desired imprint area $A_1$.

In one example, the height ratio between mesa 20 and remaining template 18 (e.g., body of template 18) may be varied. As polymerizable material 34 fills the volume between features 24 and 26 of template 18 and the edge of mesa 20, polymerizable material 34 may accumulate outside of the desired imprint area $A_1$ of substrate 12 forming extrusions. For example, accumulation of polymerizable material 34 may cause polymerizable material 34 to rise to substantially the same height $h_1$ as mesa 20 forming extrusions. By increasing height $h_1$ of mesa 20, the effect of the accumulation of polymerizable material 34 may be reduced outside of the desired imprint area $A_1$ of substrate 12. For example, height $h_1$ of mesa 20 may be increased by a factor of 10 (e.g., from approximately 15 µm to approximately 135 µm). The increase in height $h_1$ may delay the accumulation of polymerizable material 34 outside of the desired imprint area of substrate 12. Such a delay may further increase the number of successive imprints that may be made before template 18 needs removal and/or cleaning.

Figure 4:
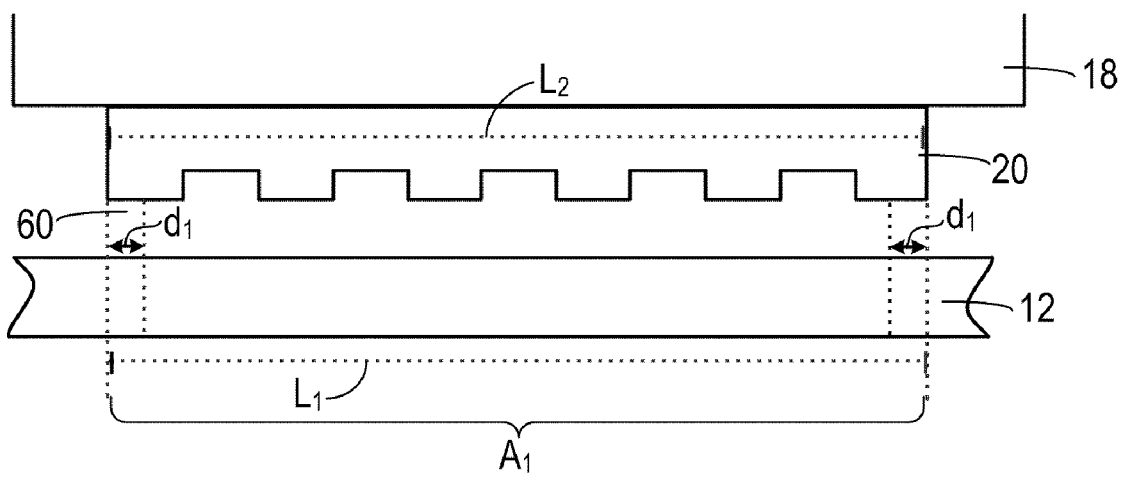
FIG. 4 illustrates a simplified side view of an exemplary template for use in a lithographic system.

In another example, extrusions may be reduced and/or prevented by varying the ratio of at least one dimension of the desired imprint area $A_1$ of substrate 12 to at least one dimension of mesa 20 to form one or more extrusion zones 60. For example, as illustrated in FIG. 4, a length $L_1$ of the desired imprint area $A_1$ of substrate 12 may be less than a length $L_2$ of mesa 20 such that extrusion zone 60 may be formed. Extrusion zones 60 may have a distance $d_1$ of approximately 50 µm to 300 µm. For example, the distance $d_1$ of extrusion zone 60 may be approximately 300 µm. It should be noted that by varying dimensions of mesa 20 and/or desired imprint area $A_1$ multiple extrusion zones 60 may be formed having similar and/or different distances $d_1$.

Masking

Figure 5A:
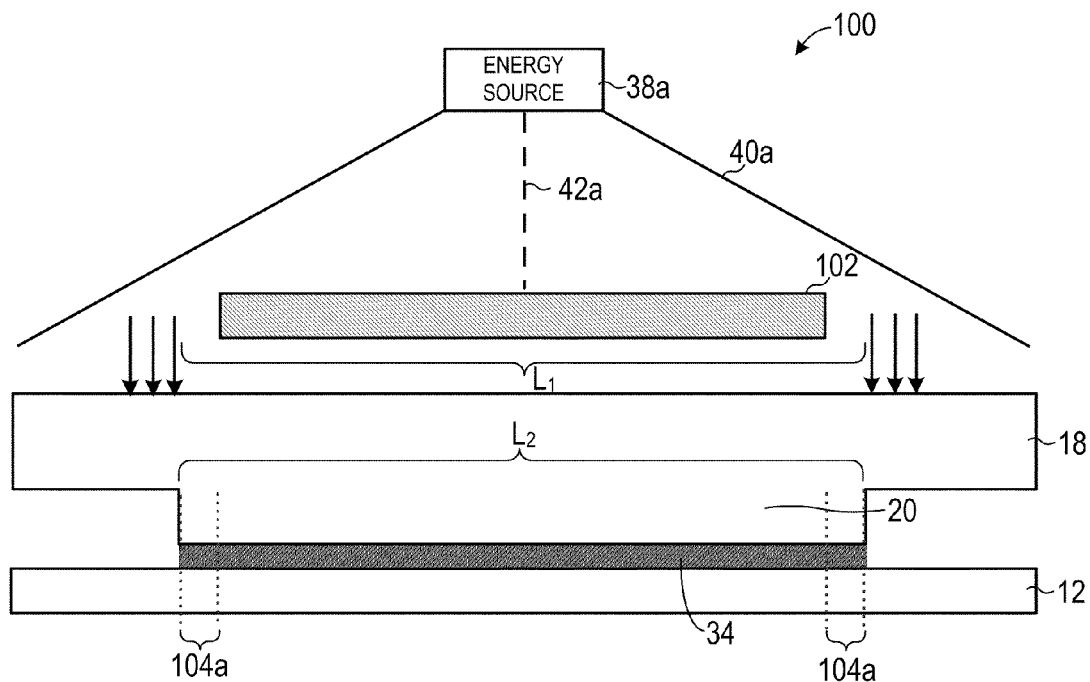
FIGS. 5A and 5B illustrate simplified side view of an exemplary masking system for use in a lithographic system.
Figure 5B:
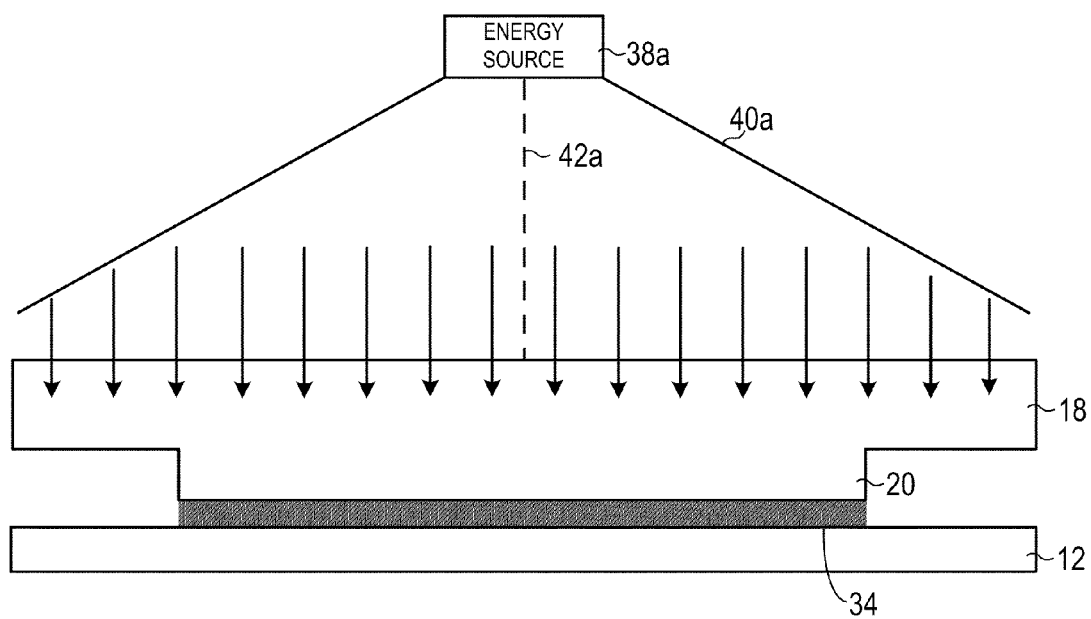

Referring to FIGS. 1, 5A and 5B, a masking system 100 may be used in system 10. Masking system 100 may reduce and/or prevent extrusion formation. Masking system 100 includes a mask 102 and an energy source 38a. Energy source 38a provides energy 40a (e.g., ultraviolet radiation) in path 42a. Template 18 and substrate 12 may be in superimposition with path 42a. It should be noted energy source 38a may be similar to energy source 38 shown in FIG. 1. Alternatively, energy source 38, shown in FIG. 1, in addition to or in lieu of energy source 38a, may provide energy 40a along path 42a.

Mask 102 may block a portion of energy 40a in path 42a. For example mask 102 may be fabricated such that a length $L_1$ of mask 102 is less than a length $L_2$ of mesa 20 providing for exposure of polymerizable material 34 within a band 104a. Band 104a may result from at least one edge of mesa 20 remaining substantially unblocked by mask 102. Band 104a may have a minimum width $w_1$ between approximately 2-10 µm. For example, band 104a may have a width $w_1$ of approximately 3 µm. It should be noted that width $w_1$ may be larger depending on application and design considerations.

Mask 102 blocks exposure of polymerizable material 34 between mesa 20 and substrate 12 except for polymerizable material 34 within band 104a. As such, polymerizable material 34 within band 104a may be cured and/or solidified, while the remaining polymerizable material 34 between mesa 20 and substrate 12 may remain in fluid form. Solidified polymerizable material 34 within band 104a may thus be able to confine fluid polymerizable material 34 within the desired imprint area $A_1$ (e.g., the boundaries of mesa 20). Mask 102 may then be removed and polymerizable material 34 within the boundaries of mesa 20 may be cured and/or solidified as illustrated in FIG. 5B.

It should be noted that energy 40a passing through mask 102 may reflect and/or diffract as it propagates. For example, energy 40a passing through mask 102 may diffract as it propagates the separation distance between mask 102 and template 18. Such reflection and/or diffraction may result in blurring. As such, projection optics for lithography may be used to reduce or eliminate blurring. For example, projection option for 0.5 μm lithography may be used. Alternatively, mask 102 may be placed in close proximity to template 18 to reduce and/or eliminate blurring.

Figure 6:
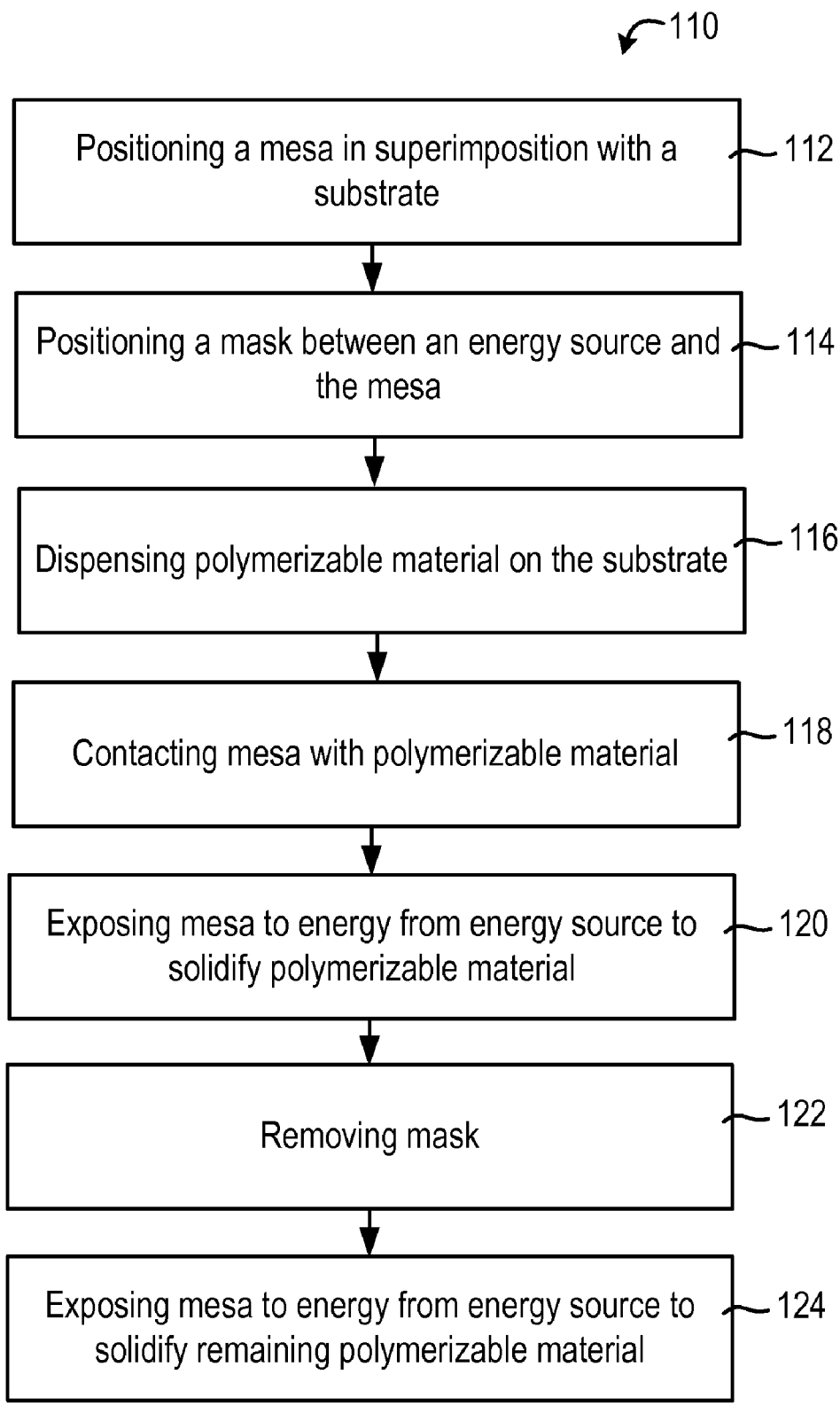
FIG. 6 illustrates a flow chart of an exemplary method for preventing extrusion formation during imprint lithography using a masking system.

FIG. 6 illustrates a flow chart of an exemplary method 110 for preventing extrusion formation during imprint lithography using masking system 100. In a step 112, mesa 20 may be positioned in superimposition with substrate 12 along path 42. In a step 114, mask 102 of masking system 100 may be positioned between energy source 38a and mesa 20. Positioning of mask 102 may provide band 104a between mesa 20 and substrate 12 that is exposed to energy 40a when energy source 38a is in an active state. Band 104a may be substantially unblocked from exposure to energy 40a. In a step 116, polymerizable material 34 may be dispensed on substrate 12. In a step 118, the distance between template 18 and substrate 12 may be reduced such that mesa 20 contacts polymerizable material 34. In a step 120, energy source 38a may provide energy 40a in path 42a to cure and/or solidify polymerizable material 34 within band 104a. Polymerizable material 34 between mesa 20 and substrate 12 outside of unblocked band 104 may remain in fluid form. In a step 122, mask 102 may be removed. In a step 124, polymerizable material 34 between mesa 20 and substrate 12 cured and/or solidified.

Filtering

Figure 7A:
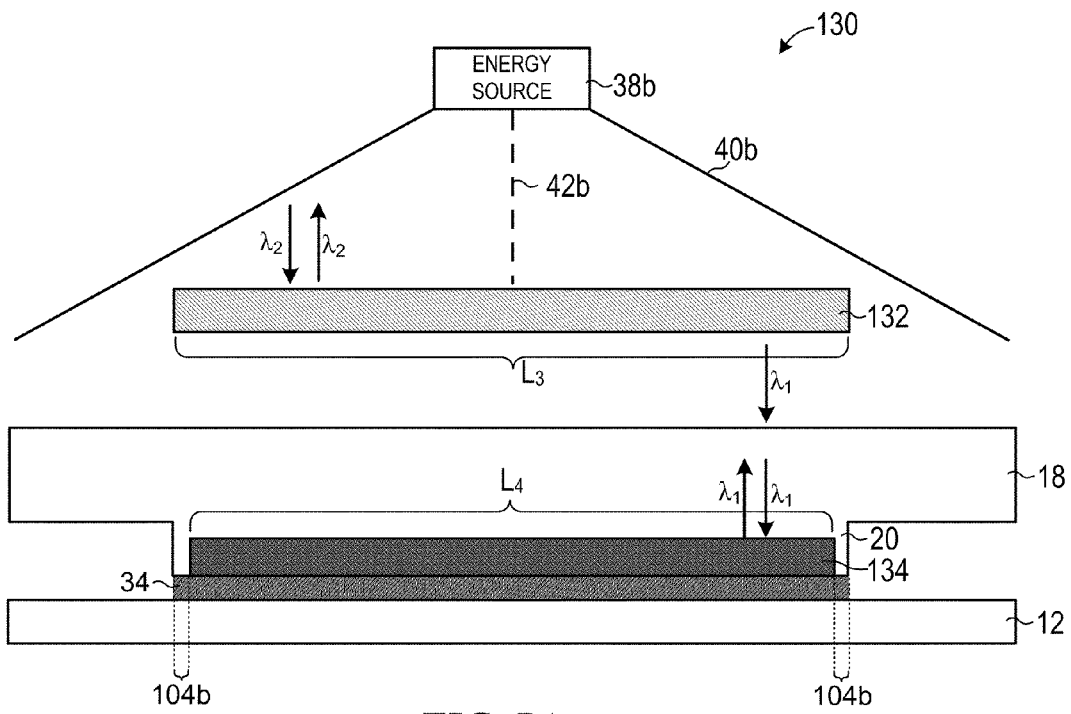
FIGS. 7A and 7B illustrate an exemplary filtering system that may be used in a lithographic system.
Figure 7B:
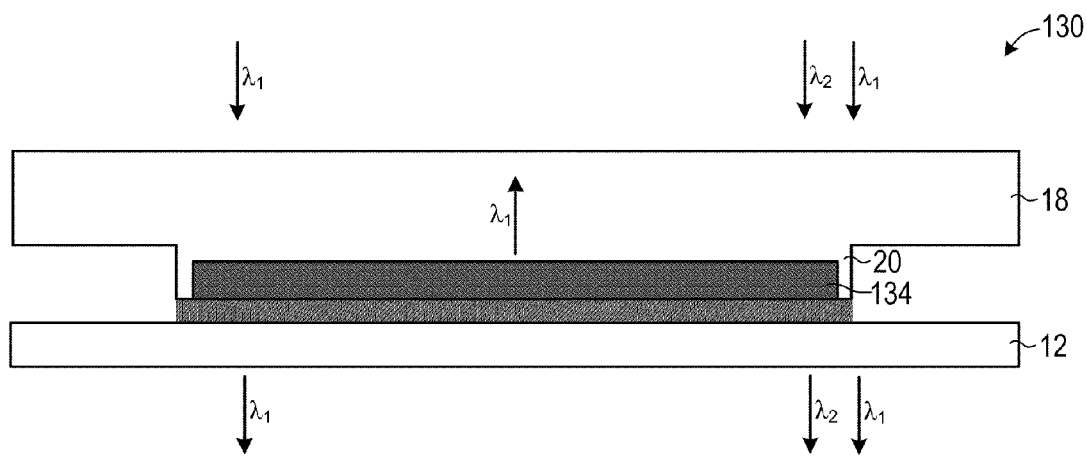

FIGS. 7A and 7B illustrate an exemplary filtering system 130 that may be used in system 10. Filtering system 130 may reduce and/or prevent extrusion formation. Filtering system 130 may include a first filter 132, a second filter 134, and an energy source 38b. Energy source 38b may provide energy 40b along path 42b.

Energy 40b may have one or more wavelengths λ. Wavelengths λ as described herein may be single wavelength or a wavelength range. Mesa 20 and substrate 12 may be in superimposition with path 42b. It should be noted energy source 38b may be similar to energy sources 38 and/or 38a shown in FIGS. 2 and 5A.

Filters 132 and 134 may be any suitable filter (e.g., optical filter). For example, first filter 132 and/or second filter 134 may be a thin film interference filter. First filter 132 may be able to transmit energy 40b having a wavelength $\lambda_1$ while blocking energy 40b having a wavelength of $\lambda_2$. Second filter 134 may be able to block energy 40b having wavelength $\lambda_1$. In some embodiments, wavelength $\lambda_1$ and/or wavelength $\lambda_2$ may be in the wavelength range of about 180 nm to about 430 nm. For example, in one example, wavelength $\lambda_1$ may have a range of about 310 nm to about 360 nm, and wavelength $\lambda_2$ may be no more than about 200 nm. Although only two filters 132 and 134 are described, it should be noted that additional filters may be used in accordance with the described filtering system 130.

Second filter 134 may be included in template 18. For example, template 18 may be hollow and second filter 134 positioned adjacent to mesa 20. Alternatively, second filter 134 may be positioned adjacent to template 18.

First filter 132 may be fabricated such that a length $L_3$ of first filter 132 is greater than a length $L_4$ of second filter 134. For example, length $L_4$ of second filter 134 may be less than length $L_3$ of first filter 132 creating a band 104b. Band 104b may have a width $w_2$. For example, a minimal width $w_2$ of band 104b may be between approximately 2-10 μm. It should be noted that the width $w_2$ may be larger depending on application and design considerations.

Positioning of the first filter 132 relative to the second filter 134 may create band 104b. For example, the first filter 132 may be placed in superimposition with second filter 134 along path 42b such that energy 40b with wavelength $\lambda_2$ may be blocked by first filter 132 and energy 40b with wavelength $\lambda_1$ may block an area between mesa 20 and substrate 12 filtered by second filter 134 creating band 104b. Consequently, during imprinting, polymerizable material 34 that may spread into band 104b may be cured and/or solidified by energy 40b having wavelength $\lambda_1$. First filter 132 may then be removed to expose all remaining polymerizable material 34 to energy 40b having wavelength $\lambda_2$. As second filter 134 may transmit energy 40b having wavelength $\lambda_2$, polymerizable material 34 between mesa 20 and substrate 12 may be cured and/or solidified.

Figure 7C:
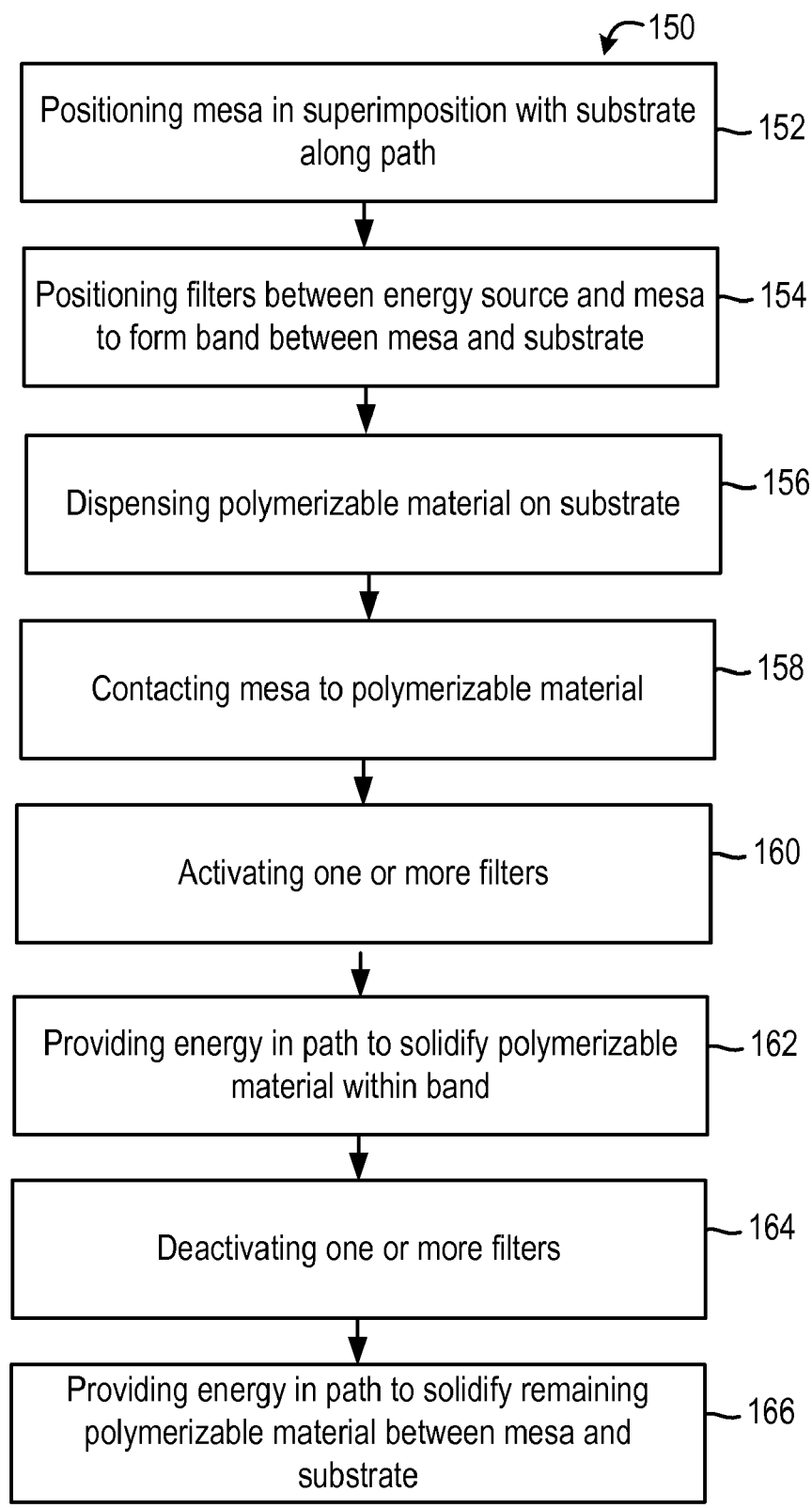
FIG. 7C illustrates a flow chart of an exemplary method for preventing extrusion formation using a filtering system.

FIG. 7C illustrates a flow chart of an exemplary method 150 for preventing extrusion formation during imprint lithography using filtering system 130. In a step 152, mesa 20 may be positioned in superimposition with substrate 12 along path 42b. In a step 154, filters 132 and 134 may be positioned between energy source 38b and mesa 20. Positioning of filters 132 and 134 may provide band 104b between mesa 20 and substrate 12 that may be exposed to energy 40b when energy source 38b is in an active state. For example, band 104b may be substantially unblocked from exposure to energy 40b. In a step 156, polymerizable material 34 may be dispensed on substrate 12. In a step 158, the distance between template 18 and substrate 12 may be reduced such that mesa 20 contacts polymerizable material 34. In a step 160, filter 132 and 134 may be activated. In a step 162, energy source 38b may provide energy 40b in path 42b to cure and/or solidify polymerizable material 34 within band 104b. Polymerizable material 34 between mesa 20 and substrate 12 outside of unblocked band 104b may remain in fluid form. In a step 164, at least one filter 132 and/or 134 may be deactivated. In a step 166, polymerizable material 34 between mesa 20 and substrate 12 cured and/or solidified.

Figure 8A:
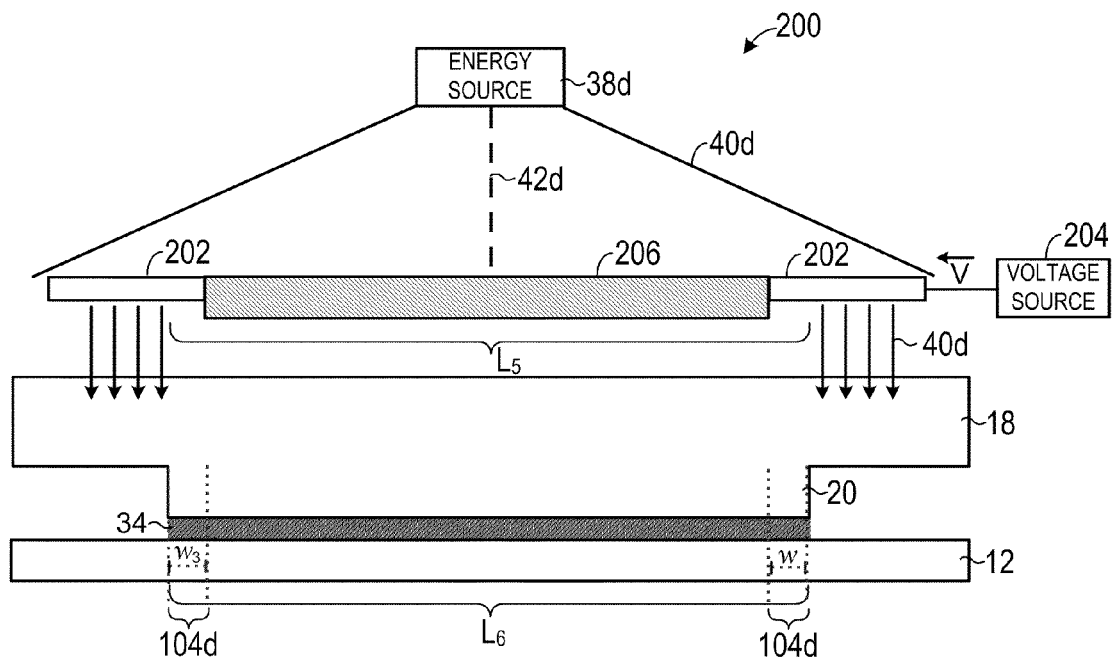
FIGS. 8A and 8B illustrate an exemplary filtering system for use in a lithography system.
Figure 8B:
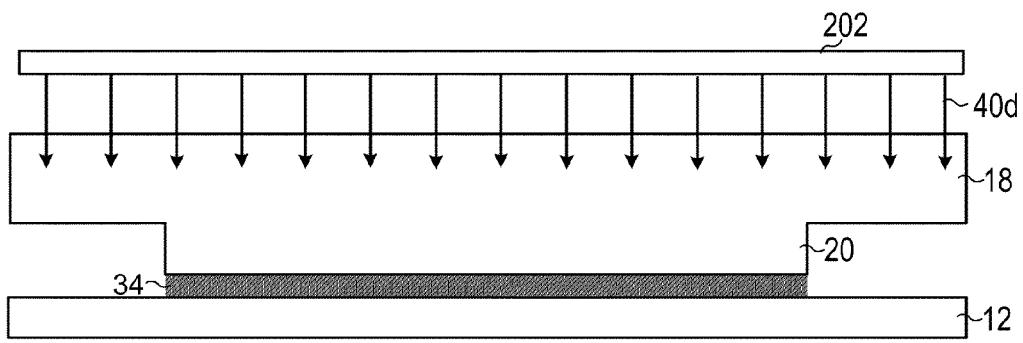

FIGS. 8A and 8B illustrate an exemplary filtering system 200 that may be used in system 10. Filtering system 200 may reduce and/or prevent extrusion formation. Filtering system 200 includes at least one electrochromic window 202, a voltage source 204, and an energy source 38d. Generally, electrochromic window 202 may become opaque upon application of voltage V from voltage source 204. Once opaque, electrochromic window 202 blocks exposure of at least a portion of template 18 and/or substrate 12 to energy 40d.

Electrochromic window 202 may alter opacity between a colored, translucent state and a transparent state in response to voltage. This property may be used to block one region of the imprint field while exposing another to energy 40d.

Energy source 38d provides energy 40d to template 18 and/or substrate 12 along path 42d. Generally, template 18 may be placed in superimposition with substrate 12 and energy 40d provided path 42d. Energy source 38d may be similar to energy source 38a, 38b, and/or 38c. Alternatively, energy source 38a, 38b, and/or 38c may be used in system 200.

At least one region 206 of electrochromic window 202 may be in superimposition with substrate 12 and/or template 18. Region 206 of electrochemical window 202 may have a length $L_5$ less than a length $L_6$ of a desired area of imprinting on substrate 12. The difference between length $L_5$ of region 206 of electrochromic window 202 and length $L_6$ of the desired area on substrate 12 may form a band 104d. For example, the difference may provide band 104d around the perimeter of mesa 20. Band 104d may have a width $w_3$. For example, band 104d may have a width $w_3$ between 2-10 μm. It should be noted that width $w_3$ may be larger depending on application and/or design considerations.

During imprinting, as polymerizable material 34 spreads across substrate 12, voltage V may be applied to electrochromic window 202. Region 206 of electrochromic window 202 may become opaque. With region 206 opaque, band 104d may be exposed to energy 40d with the remaining area between template 18 and substrate 12 blocked from energy 40d by region 206. Consequently, polymerizable material 34 that spreads into band 104d may be cured and/or solidified, while the remaining polymerizable material 34 between template 18 and substrate 12 may remain fluid. Polymerizable material 34 that remains fluid may be confined within the boundaries of mesa 20 by solidified polymerizable material 34 in band 104d. This may prevent polymerizable material 34 in fluid form from leading out of the boundaries of mesa 20 to form extrusions during imprint lithography. Electrochromic window 202 may be turned off to expose the remaining area between template 18 and substrate 12 to expose all remaining polymerizable material 34 to energy 40d as illustrated in FIG. 8B.

Figure 9:
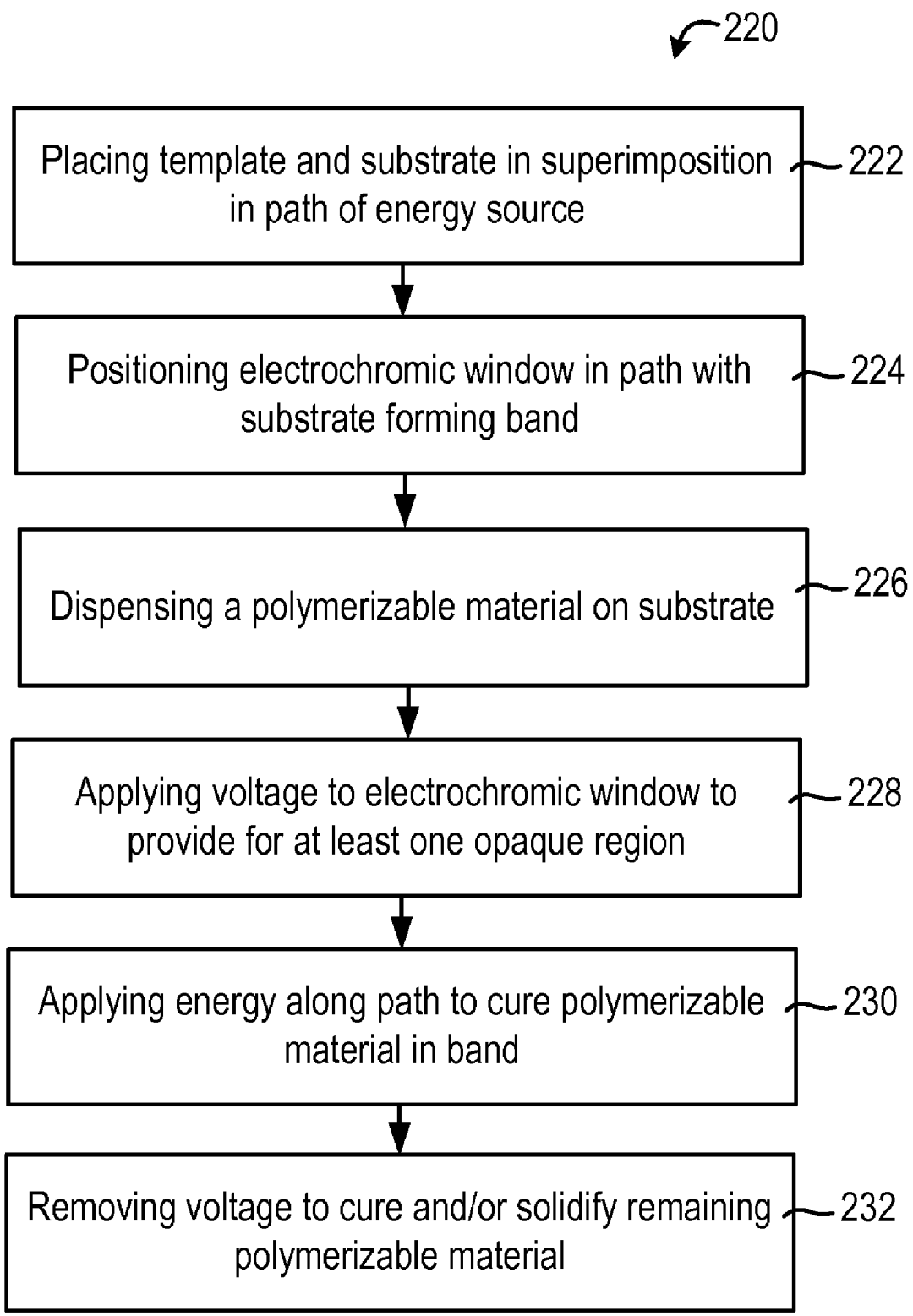
FIG. 9 illustrates a flow chart of an exemplary method for preventing extrusion formation using a filtering system.

FIG. 9 illustrates a flow chart of an exemplary method 220 for preventing extrusion formation using system 200. In a step 222, template 18 and substrate 12 may be placed in superimposition in path 42d or energy source 38d. In a step 224, electrochromic window 202 may be positioned in superimposition with substrate 12 to form band 104d. In a step 226, polymerizable material 34 may be dispensed on substrate 12. In a step 228, voltage may be applied to electrochromic window 202 providing opaque region 206. In a step 230, energy 40d may be applied along path 42d to cure polymerizable material 34 in band 104d. In a step 232, voltage V may be removed to cure and/or solidify remaining polymerizable material 34.

Figure 10A:
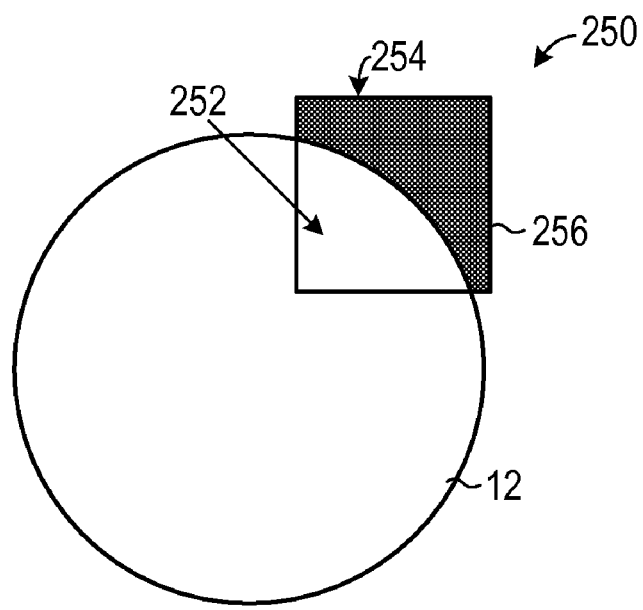
FIGS. 10A and 10B illustrate an exemplary filtering system to block energy to one or more curved areas of a substrate.
Figure 10B:
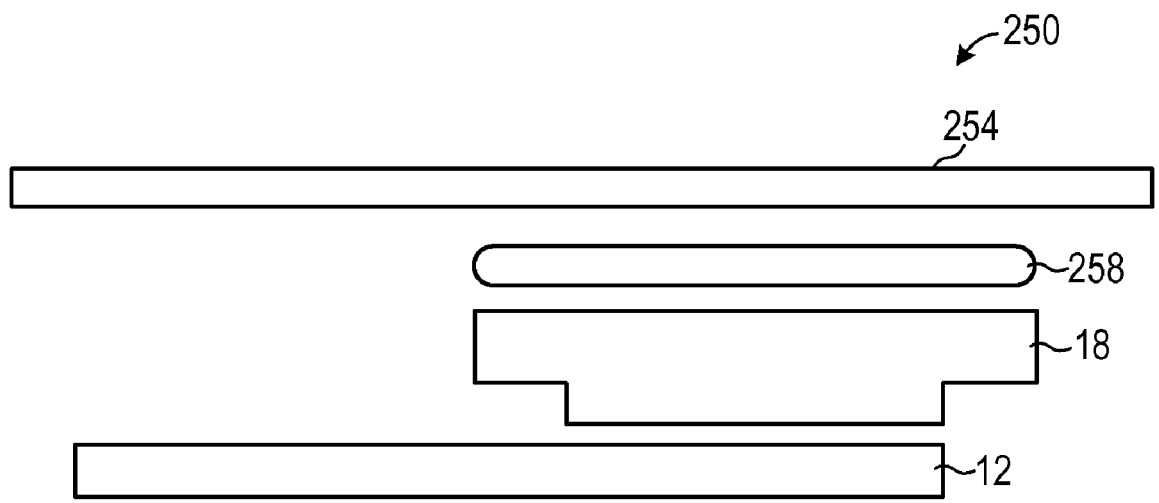

FIGS. 10A and 10B illustrate an exemplary system 250 to block one or more curved areas 252 of substrate 12 to provide step-to-edge exposure control during edge-field imprinting. Generally, system 250 includes an electrochromic film 254. At least one region 256 of electrochromic film 254 may turn opaque to energy 40 in response to voltage. For example, region 256 of electrochromic film 254 may turn opaque in response to voltage and block edge of substrate 12 (e.g., circular wafer) from exposure to energy 40e from energy source 38e. Additionally, system 250 may include the use of a lens 258. Lens 258 may be inserted between electrochemical film 254 and template 18. For example, lens 258 may be inserted between electrochemical film 254 and template 18 to sharpen shadow edges.

Maze Patterns

Referring to FIGS. 1, 2 and 11A-B, formation of maze pattern 300 may prevent polymerizable material 34 from leaking out of the boundaries of mesa 20 during imprinting. FIG. 11 illustrates an exemplary maze pattern 300 patterned on mesa 20. Generally, maze pattern 300 includes an array 302 of features 304. Maze pattern 300 may be applied on the boundary of mesa 20 such that when polymerizable material 34 reaches features 304 in maze pattern 300, features 304 may slow or stop propagation of polymerizable material 34. For example, propagation of polymerizable material 34 may be slowed by the relatively small capillary forces in comparison to the large capillary forces during spreading of polymerizable material on substrate 12. Additionally, propagation may be slowed by large pockets of gas (e.g., He) trapped in features 304 based on the rate of diffusion of the gas.

Figure 11A:
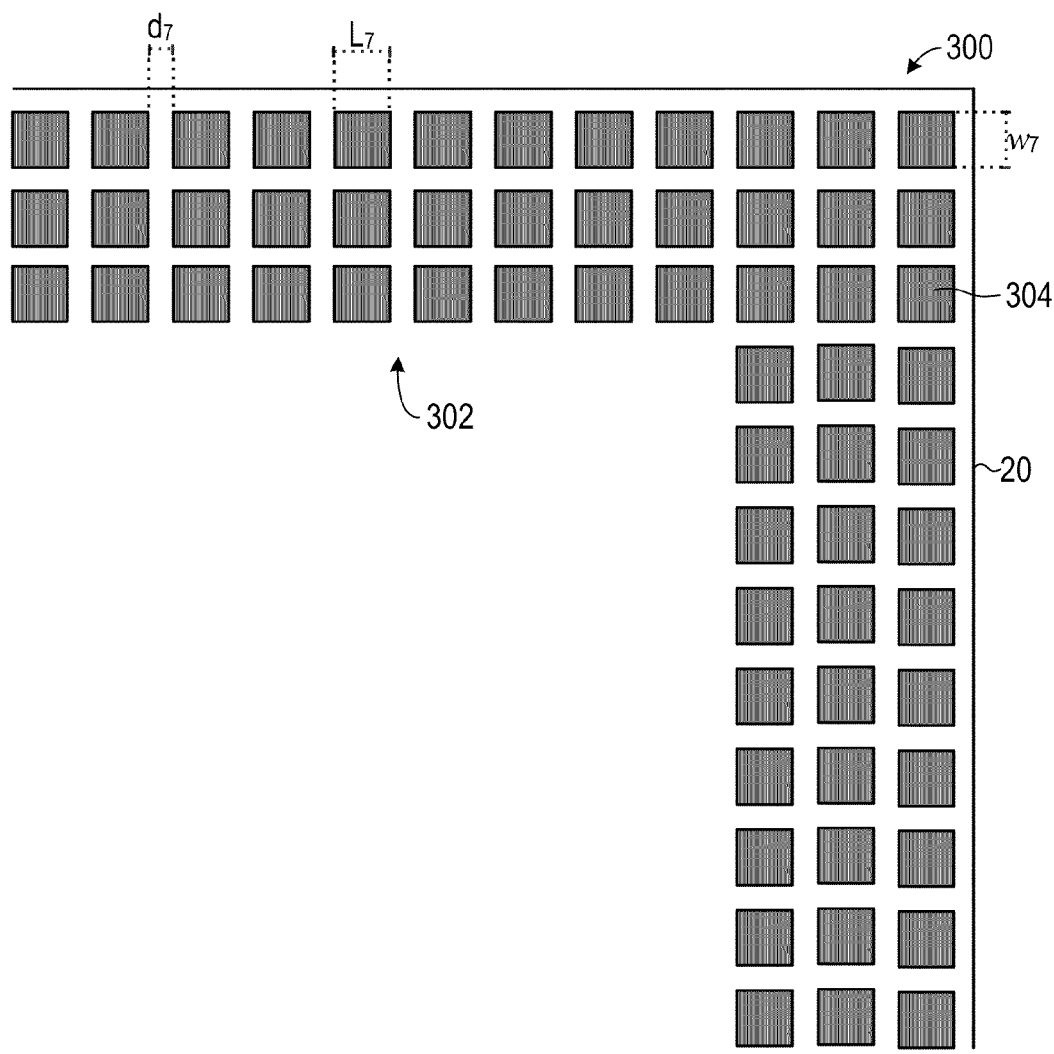
FIGS. 11A and 11B illustrate exemplary maze patterns on a mesa.
Figure 11B:
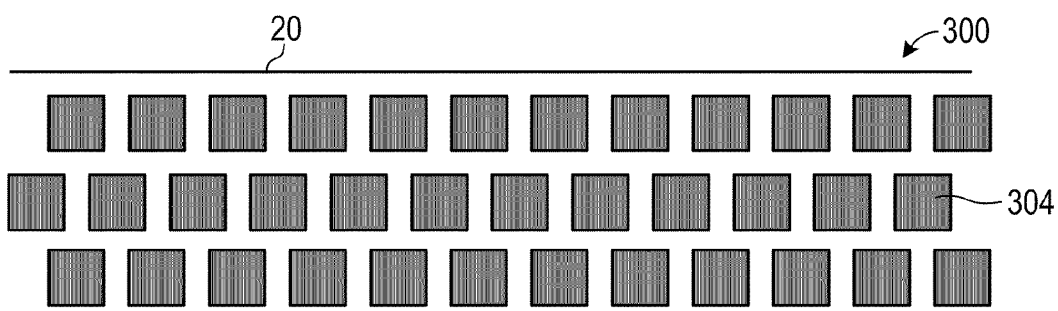

Features 304 may be any geometric shape and/or fanciful shape. For example, FIG. 11 illustrates maze patterns 300 having multiple rows of spaced apart square features 304, wherein at least one of said multiple rows surrounds at least one other of said multiple rows and is positioned closer to the mesa boundary. Square features 304 have a length $L_7$ (e.g., 2 μm) a width $w_7$ (e.g., 2 μm), and a height $h_7$ (e.g., 100 nm). Features 304 may be distanced apart from other features by a distance $d_7$ (e.g., 0.8 μm). Features 304 may be aligned as illustrated in FIG. 11A or staggered as illustrated in FIG. 11B. Features may be patterned on substrate 12 using techniques including, but no limited to, imprint lithography, Generally, maze pattern 300 may have a fill factor f (e.g., 50%). Generally, fill factor f is a ratio between the total area of features 304 within a portion of maze pattern 300 and the entire area of that portion of maze pattern 300. Maze pattern 300 may have positive or negative tone depending on features 304. For example, if features 304 are depressed, then the maze pattern may be positive. If features 304 are standing out on mesa 20, then maze pattern 300 may be negative. A maze pattern 300 having a positive tone with a fill factor f and height $h_7$ may form minimal or near zero thickness $t_2$ of residual layer 48 if polymerizable material 34 has a volume V less than or equal to threshold volume $V_O$, wherein threshold volume $V_O$ is:

$$V_O = h \times f \times S \qquad [\text{EQ. 1}]$$

wherein S is the area of a template 18.

A minimal or near zero thickness $t_2$ of residual layer 48 (shown in FIG. 2) may not be required for the boundaries of mesa 30 that includes maze pattern 300 in certain circumstances. For example, minimal thickness $t_2$ may not be required for template 18 having a sparse amount of features 24 and/or 26. In these circumstances, template 18 may have low density features 24 and/or 26 or small features 24 and/or 26 that may fill at a faster rate. A lesser amount of polymerizable material 34 may be required for template 18 having low density features 24 and/or 26. Timing techniques may be used to reduce or stop the spread of polymerizable material outside of the boundaries of mesa 20. For example, template 18 may fill at a rate of seven seconds. Within this period of time, features 304 of maze pattern 300 may demonstrate slow propagation of polymerizable material until polymerizable material 34 saturates maze pattern 300. As such, propagation of polymerizable material 34 may be impeded by maze pattern 300 at an early stage of the imprinting process.

For example, polymerizable material 34 may be dispensed uniformly with blank template 18 and have a total volume that forms residual layer with thickness t2 less than 50 nm.

Figure 12:
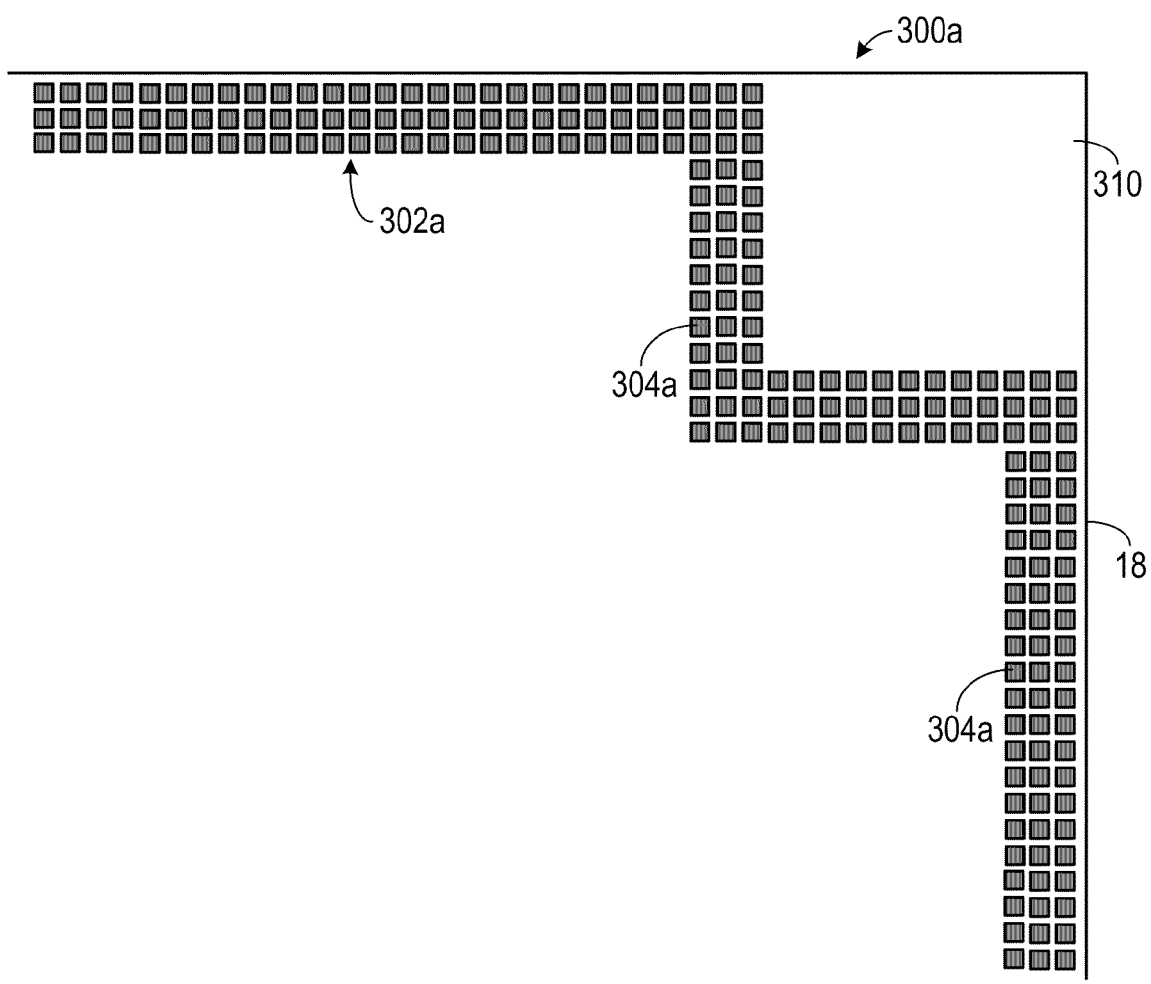
FIG. 12 illustrates an exemplary maze pattern forming a moat on a mesa.

Maze patterns 300 may be used to form moats or protect moats with one or more separating grooves (e.g., channels). FIG. 12 illustrates an exemplary maze pattern 300a forming a moat 310. Maze pattern 300a includes an array 302a or features 304a (e.g., squares). Moat 310 may further reduce or prevent spread of polymerizable material 34 outside of the boundaries of mesa 20.

Figure 13:
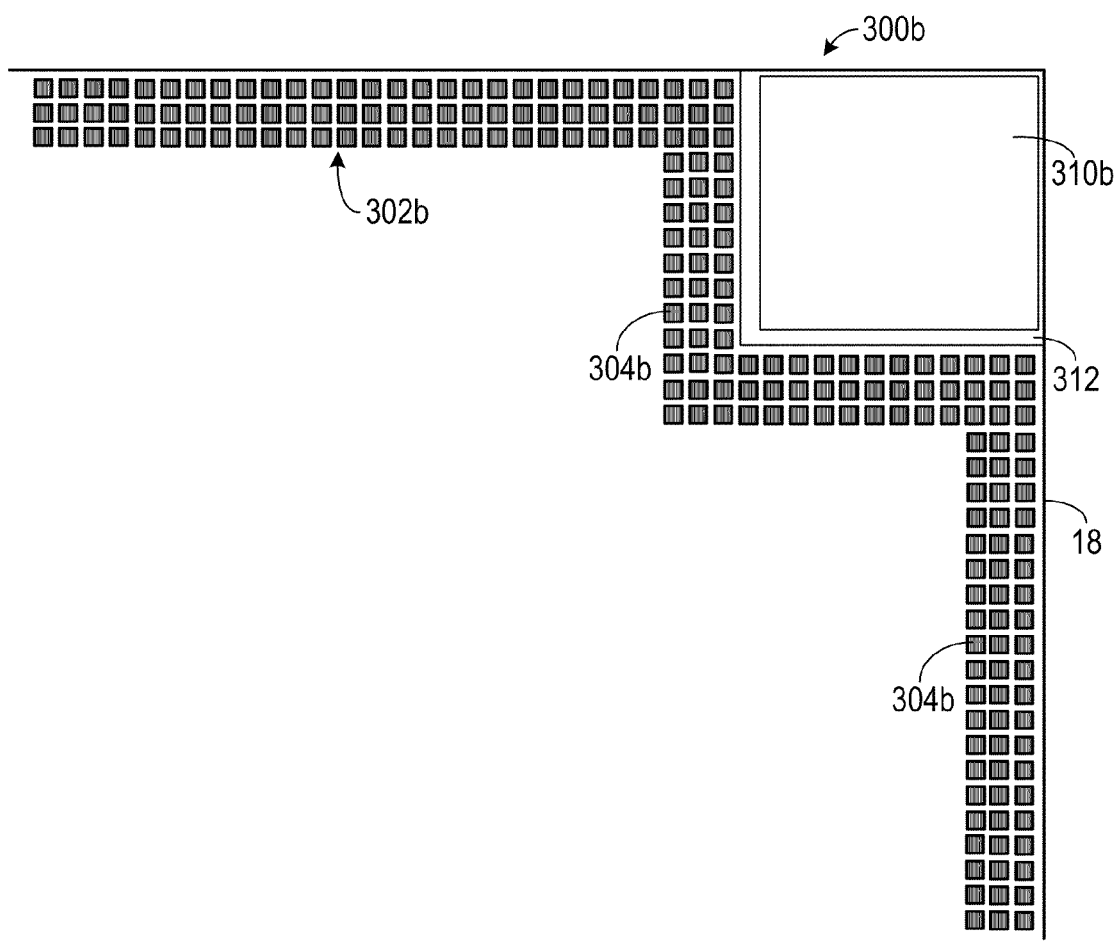
FIG. 13 illustrates an exemplary maze pattern and an exemplary channel patterned on a mesa.
Figure 14:
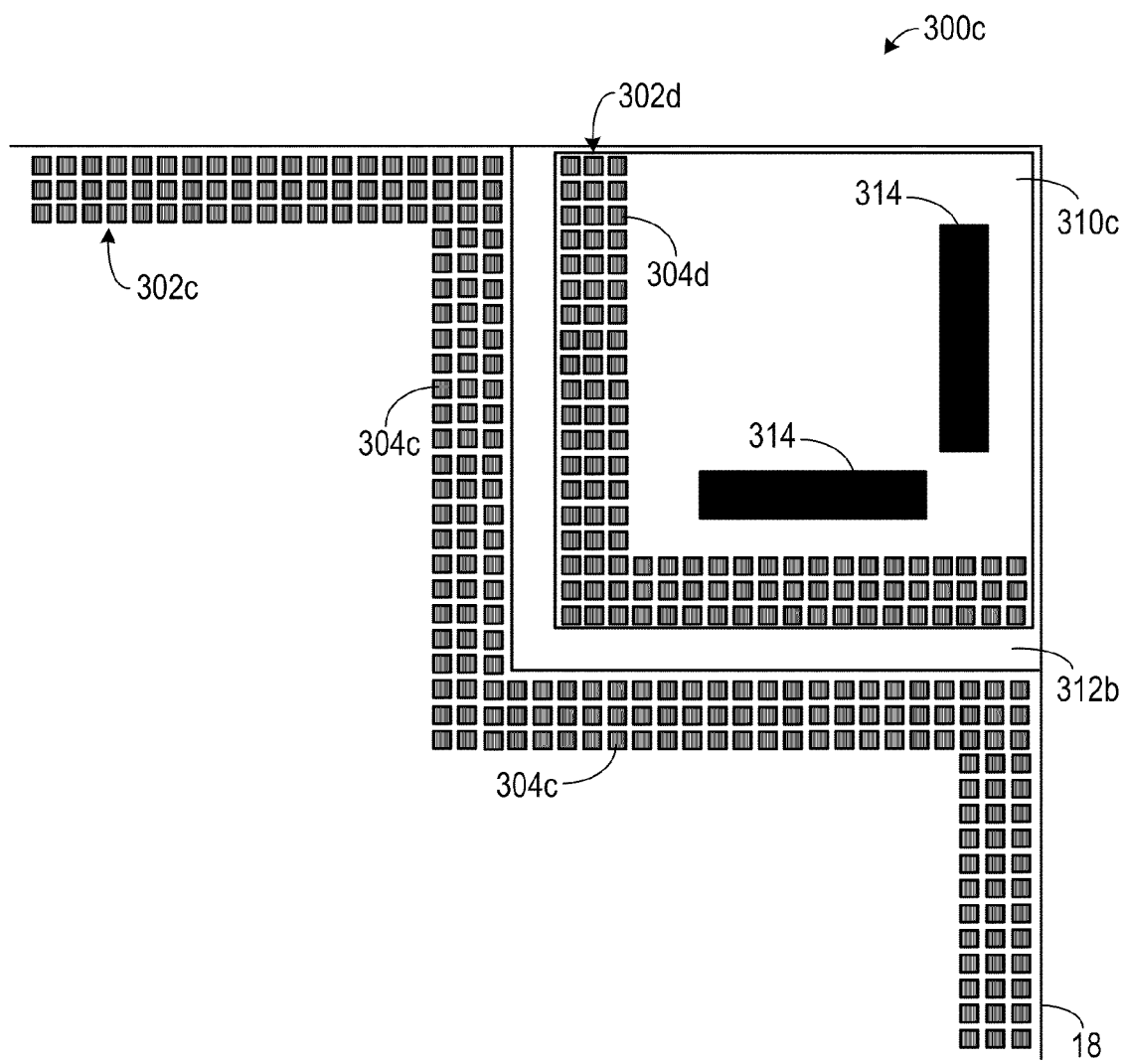
FIG. 14 illustrates an exemplary maze pattern having multiple arrays.

Additional features may be provided to reduce or prevent contamination of moat 310 in addition to maze pattern 300. For example, FIG. 13 illustrates the use of groove 312 on the perimeter of moat 310b. Groove 312 may be formed using techniques described in U.S. Pat. No. 7,309,225, which is hereby incorporated by reference herein In certain circumstances, groove 312 may be contaminated and may leak polymerizable material 34 into moat 310b. FIG. 14 illustrates exemplary maze patterns 300c having multiple arrays 302c and 302d with features 304c and 304d respectively. Arrays 302c and/or 302d may be positioned within moat 310c and/or around one or more critical features 314 (e.g., alignment marks). Features 304c and/or 304c may be any geometrical and/or fanciful shape.

Figure 15:
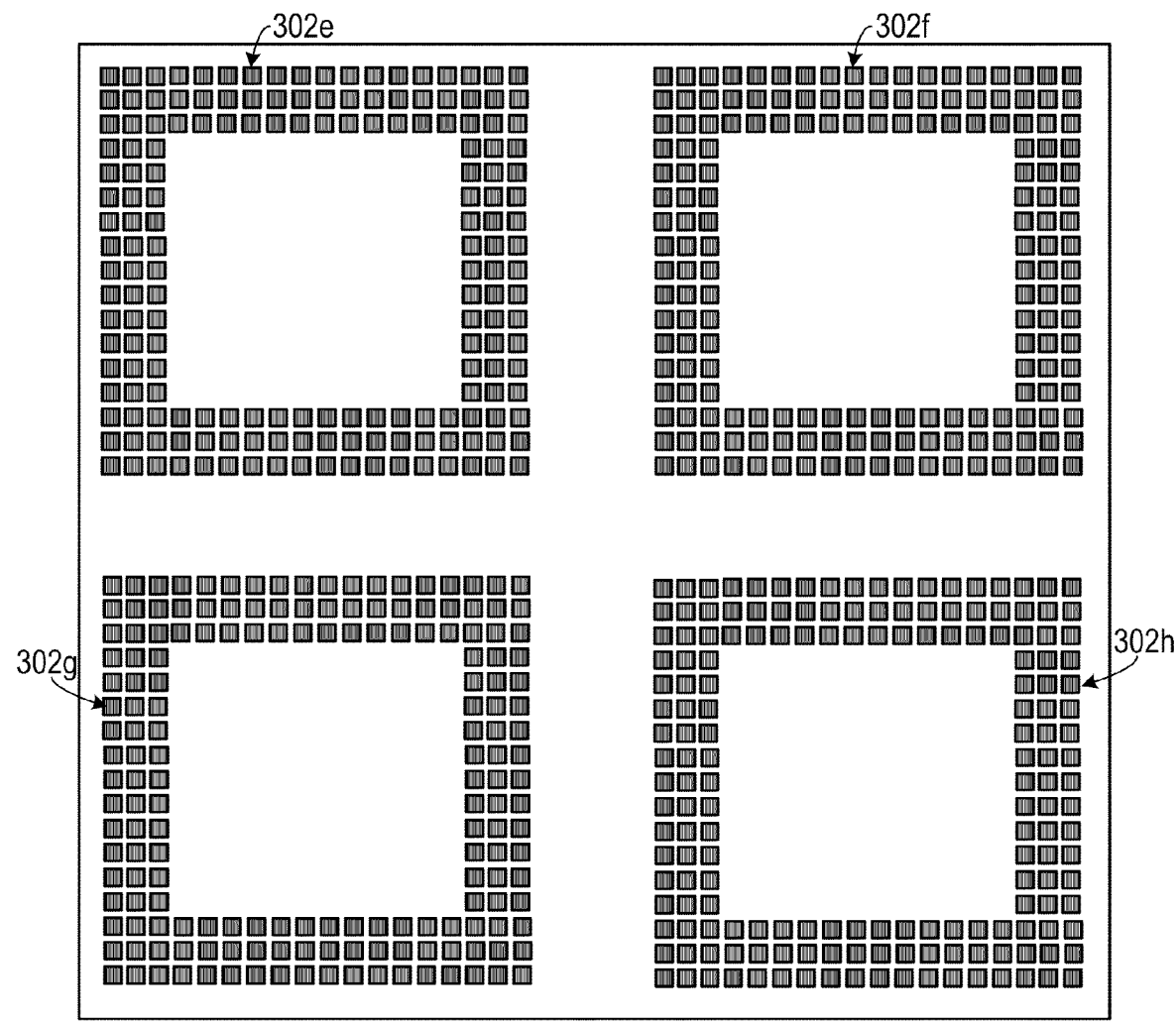
FIG. 15 illustrates an exemplary maze pattern having multiple arrays.

Mesa 20 may have multiple arrays 302 patterned thereon. For example, FIG. 15 illustrates mesa 20 having arrays 302e-302h patterned thereon. Multiple arrays 302 may reduce and/or prevent polymerizable material 34 from filing portions of mesa 20.

Figure 16:
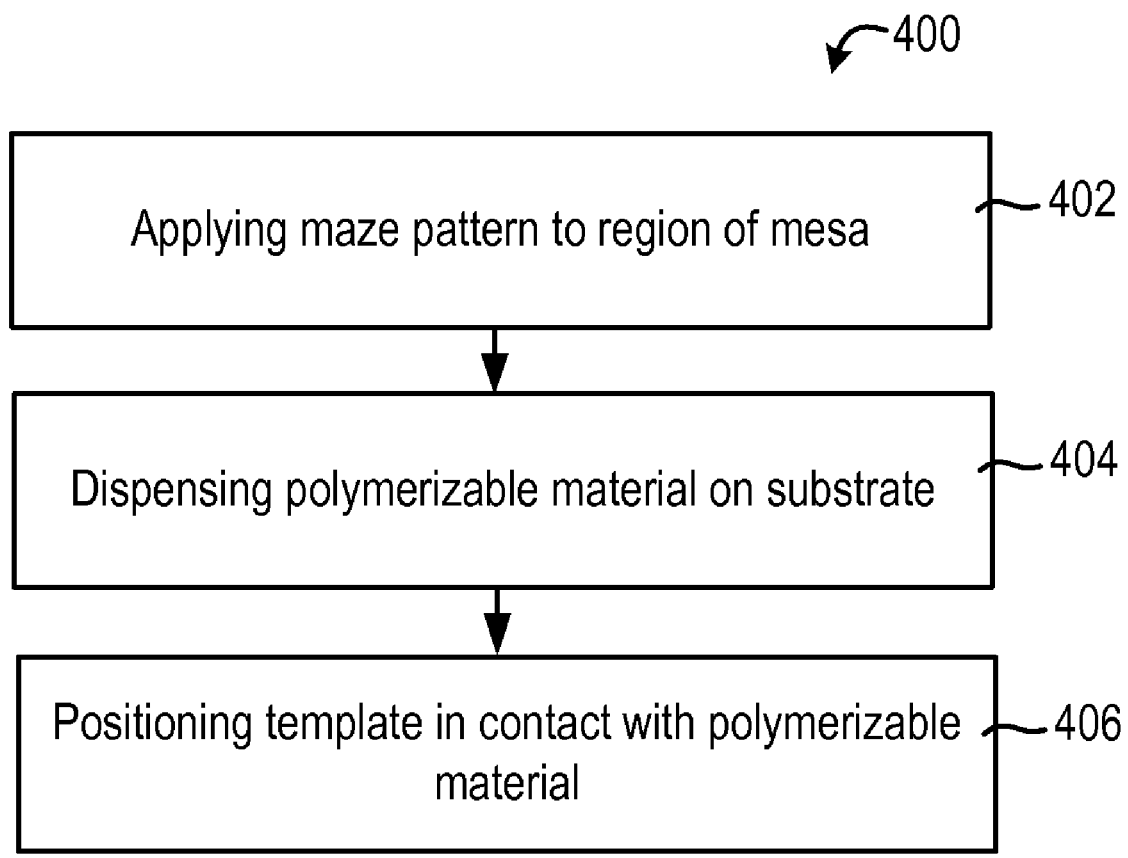
FIG. 16 illustrates a flow chart of an exemplary method for reducing and/or preventing formation of extrusions using a maze pattern.

FIG. 16 illustrates a flow chart of an exemplary method 400 for reducing and/or preventing formation of extrusions using one or more maze patterns 300. In a step 302, maze pattern may be applied to region of mesa 20. In a step 404, polymerizable material may be dispensed on substrate 12. In a step 406, template 18 may be positioned in contact with polymerizable material 34. Maze pattern 300 may reduce and/or prevent propagation of polymerizable material 34 and as such may reduce and/or prevent polymerizable material 34 from leaking out of the boundaries of mesa 20.

Fractal Structures

Figure 17A:
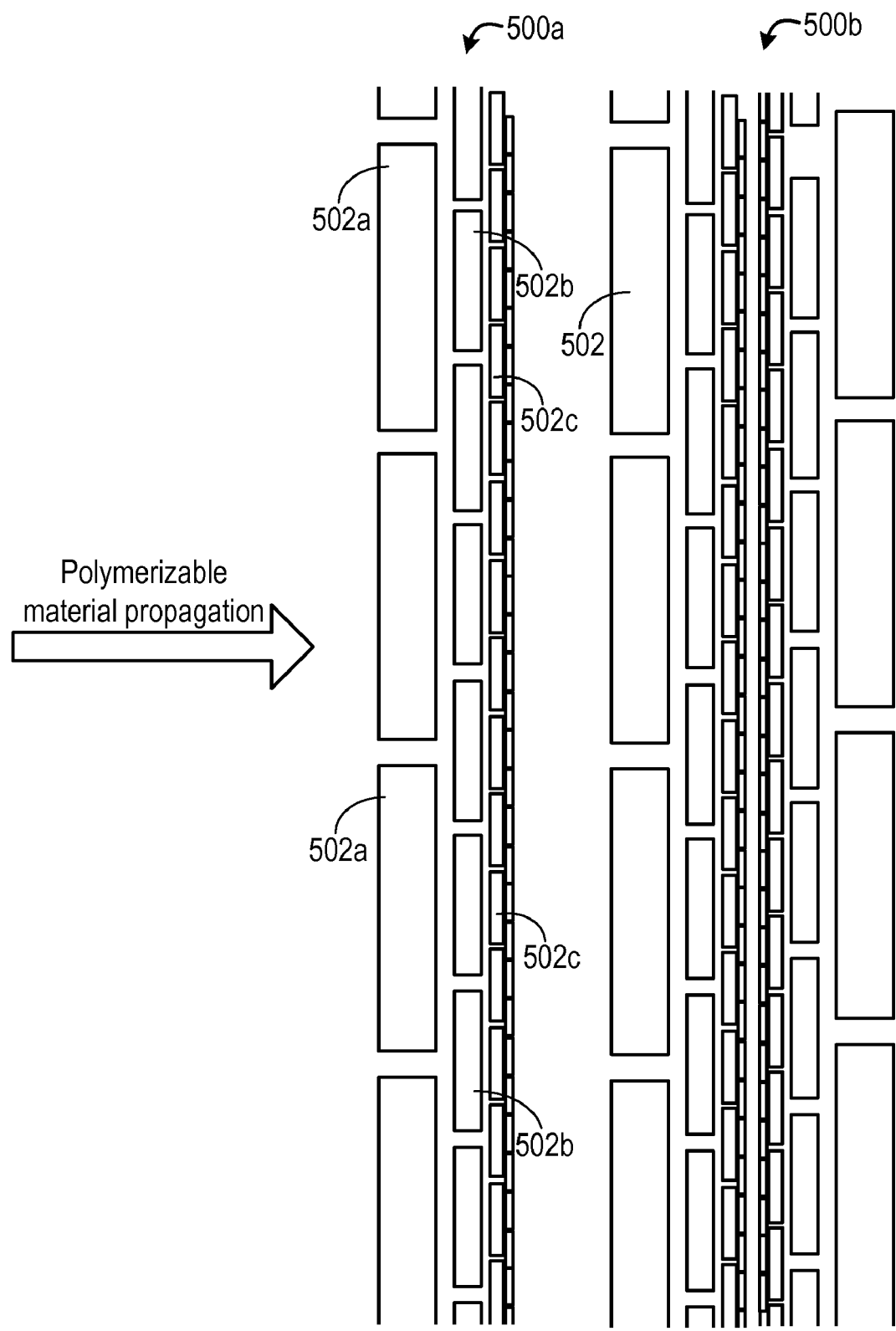
FIGS. 17A-C illustrate exemplary fractal structures for use in a lithographic system.
Figure 17B:
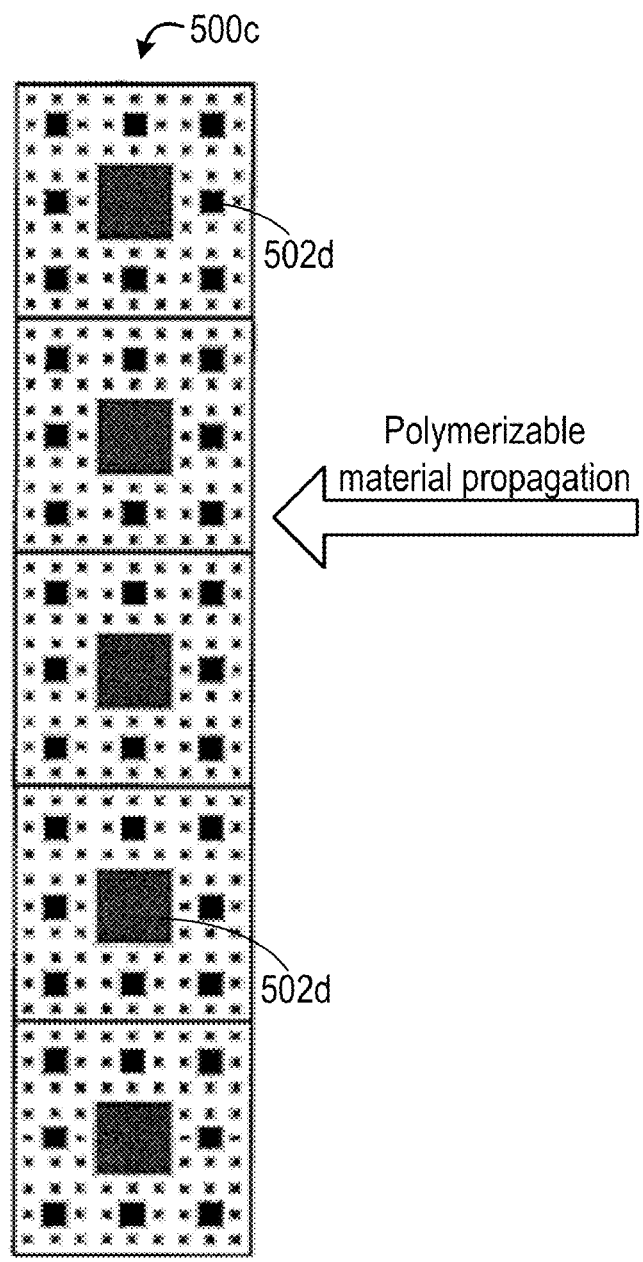

Referring to FIGS. 17A and 17B, fractal structures 500 may be used in system 10. For example, fractal structures 500 may be patterned on template mesa 20 to reduce and/or prevent propagation of polymerizable material 34 during imprinting. Generally, fractal structures 500 may reduce or increase the total length of the periphery of all the features 502 in the area under consideration for polymerizable material 34, increase surface energy of polymerizable material 34 due to increased/decreased capillary paths, and/or absorb excess volume V of polymerizable material 34 resulting in reduced propagation of polymerizable material 34. For example, polymerizable material 34 may have a high surface energy when in contact with fractal structure 500. The high surface energy may provide a repulsive force effect reducing propagation of polymerizable material 34.

FIG. 17A illustrates exemplary fractal structures 500a and 500b. Fractal structures 500a and 500b include features 502. Features 502 may be any geometric and/or fanciful shape. For example, features 502a-c in FIG. 17A are rectangular and features 502d in FIG. 17B are squares.

Features 502 may be formed in iterations with each iteration having a reduced size. For example, the first iteration of fractal structure 500a includes features 502a; the second iteration of fractal structure 500a includes features 502b; and, the third iteration of fractal structure 500a includes features 502c. Multiple iterations increase the total peripheral length of features 502 when the size of features 502 is reduced (e.g., intrinsic property of fractal geometry). The difference between patterns with larger periphery with smaller spacing, and patterns with smaller periphery with larger spacing will result in different capillary forces and kinetics of fluid propagation. As such, the change in the rate of fluid propagation may be used for to control fluid flow and/or extrusion formation.

Figure 17C:
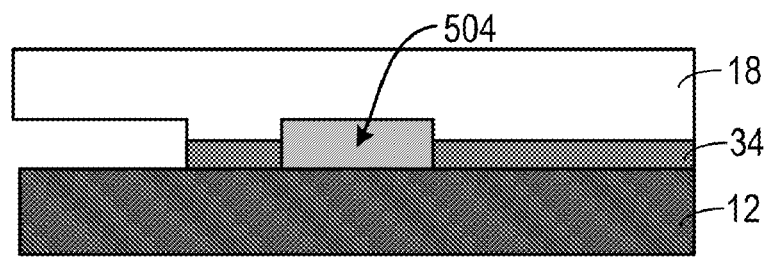

Fractal structures 500 may be used in combination with gases to reduce and/or prevent propagation of polymerizable materials 34. For example, boundaries of fractal structures may form one or more channels. These channels may trap gas pockets. For example, as illustrated in FIGS. 17A and 17C, bridges 504 between features 502 of fractal pattern 500 may act as gas barriers. As a result, propagation of polymerizable material 34 may be reduced. Further, reducing the size of features 502 may improve gas trapping. For example, fractal pattern 500b of FIG. 17A provides iterations of features 502 with reduced linear sizes towards the center. Polymerizable material 34 may fill the smaller areas faster due to stronger capillary forces (e.g. material fills at faster rate in the center region). This may lead to entrapment of gas in the larger areas where polymerizable material 34 may still be flowing.

Figure 18:
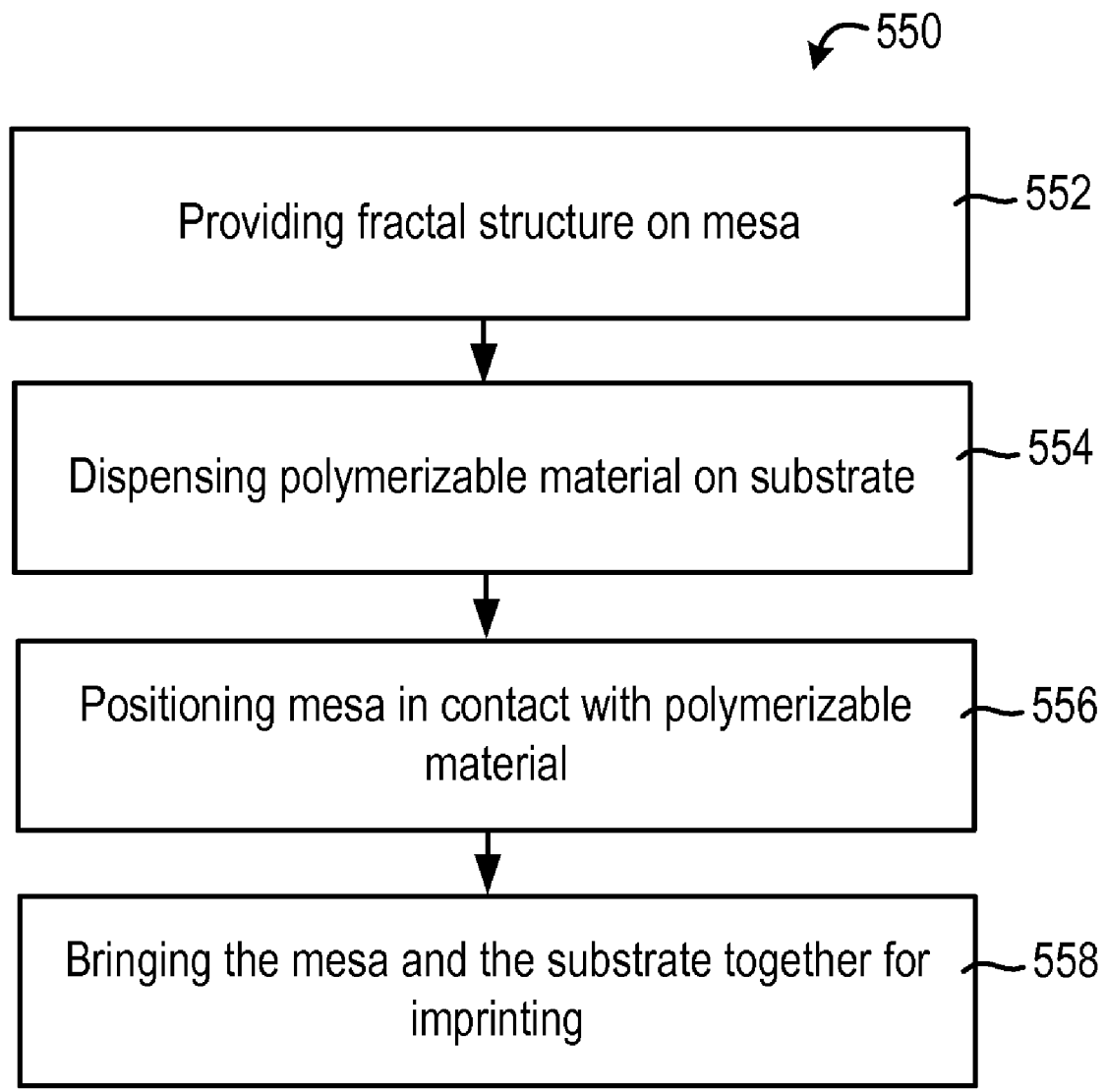
FIG. 18 illustrates a flow chart of an exemplary method for reducing and/or preventing formation of extrusions using a fractal structure.

FIG. 18 illustrates a flow chart of an exemplary method 550 for reducing and/or preventing formation of extrusions using fractal structure 500. In a step 552, fractal structure 500 may be provided on mesa 20. At a step 554, polymerizable material 34 may be dispensed on substrate 12. Fractal structure 500 on mesa 20 may reduce and/or prevent propagation of polymerizable material 34 and reduce and/or prevent polymerizable material 34 from spreading beyond boundaries of mesa 20.

What is claimed is:

1. A method comprising:
    patterning a mesa of an imprint lithography template with patterned features and a first maze pattern distinct from the patterned features, said first maze pattern comprising an array of depressed or protruding spaced apart features positioned at the boundary of the mesa to surround said patterned features, and said array comprising multiple rows of said spaced apart features, wherein spaced apart features of at least one row are aligned or staggered with respect to spaced apart features of an adjacent row, and wherein at least one of said multiple rows surrounds at least one other of said multiple rows and is positioned closer to the mesa boundary;
    dispensing polymerizable material on a substrate; and,
    contacting the mesa of the imprint lithography template with the polymerizable material on the substrate,
    wherein the first maze pattern reduces and slows propagation of the polymerizable material beyond the mesa boundary during said contacting.

2. The method of claim 1, wherein the array of features comprises geometric shapes, fanciful shapes, or combinations thereof.

3. The method of claim 1, wherein the array of features further comprises periodic arrays of squares having a width of approximately 2 microns, a length of approximately 2 microns, and a height of approximately 80-120 nm.

4. The method of claim 1, wherein the features are spaced apart by a distance of between approximately 0.6 to 0.8 microns.

5. The method of claim 1, wherein the first maze pattern forms a moat positioned outside of the first maze pattern at the boundary of the mesa.

6. The method of claim 5, further comprising patterning a second maze pattern on the mesa, wherein the second maze pattern is positioned in the moat.

* * * * *